United States Patent
Liao et al.

(10) Patent No.: US 10,692,414 B2
(45) Date of Patent: Jun. 23, 2020

(54) DISPLAY DEVICE

(71) Applicant: Au Optronics Corporation, Hsinchu (TW)

(72) Inventors: Wei-Chien Liao, Hsinchu (TW); Meng-Chieh Tsai, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/218,494

(22) Filed: Dec. 13, 2018

(65) Prior Publication Data

US 2020/0005696 A1 Jan. 2, 2020

(30) Foreign Application Priority Data

Jun. 28, 2018 (TW) .............................. 107122277 A (51) Int. Cl.
*G09G 3/20* (2006.01)
*H01L 27/12* (2006.01)

(52) U.S. Cl.
CPC .............. *G09G 3/20* (2013.01); *H01L 27/124* (2013.01); *G09G 2300/0426* (2013.01); *G09G 2300/0439* (2013.01); *G09G 2300/0809* (2013.01)

(58) Field of Classification Search
CPC .......... H01L 27/124; G09G 2310/0283; G09G 2310/0286; G09G 2310/0278; G09G 3/20; G11C 19/00; G11C 19/28
See application file for complete search history.

(56) References Cited

U.S. PATENT DOCUMENTS

| | | | |
|---|---|---|---|
| 8,576,187 B2 | 11/2013 | Lin et al. | |
| 8,878,765 B2 | 11/2014 | Shin et al. | |
| 9,653,494 B2 | 5/2017 | Jin | |
| 9,685,131 B2 | 6/2017 | Tanaka et al. | |
| 9,704,429 B2 * | 7/2017 | Seo ...................... | G09G 3/2085 |
| 9,760,102 B2 | 9/2017 | Tanaka et al. | |
| 9,798,339 B2 | 10/2017 | Tanaka et al. | |
| 9,799,680 B2 | 10/2017 | Kao et al. | |
| 9,928,793 B2 | 3/2018 | Zhao et al. | |
| 10,032,839 B2 * | 7/2018 | Kang .................. | G09G 3/3233 |
| 10,176,775 B2 * | 1/2019 | Lee ........................ | G11C 19/00 |

(Continued)

FOREIGN PATENT DOCUMENTS

| CN | 104756177 | 7/2015 |
|---|---|---|
| CN | 104849928 | 8/2015 |

(Continued)

*Primary Examiner* — Sardis F Azongha
(74) *Attorney, Agent, or Firm* — JCIPRNET (57) ABSTRACT

A display device includes a plurality of scan lines, a plurality of data lines, a plurality of pixel units, a plurality of gate driving circuits, and a plurality of connection lines. The scan lines extend in a first direction. The data lines extend in a second direction. The gate driving circuits extend in the first direction, and each of the gate driving circuits crosses through at least two of the pixel units. At least two gate driving circuits are included between two adjacent rows of the pixel units. The connection lines extend in the second direction and are electrically connected to the gate driving circuits. At least part of the connection lines overlap the data lines. The connection lines include a plurality of output lines and a plurality of signal lines. The output lines are electrically connected to the scan lines.

10 Claims, 8 Drawing Sheets

(56) References Cited

U.S. PATENT DOCUMENTS

| | | | |
|---|---|---|---|
| 10,210,812 B2 * | 2/2019 | Kim | G09G 3/3266 |
| 2011/0273417 A1 | 11/2011 | Shin et al. | |
| 2012/0113016 A1 | 5/2012 | Lin et al. | |
| 2015/0179277 A1 * | 6/2015 | Pai | G09G 3/20 |
| | | | 377/68 |
| 2015/0293546 A1 | 10/2015 | Tanaka et al. | |
| 2016/0019856 A1 | 1/2016 | Tanaka et al. | |
| 2016/0079333 A1 * | 3/2016 | Shishido | H01L 27/3262 |
| | | | 257/72 |
| 2016/0118411 A1 | 4/2016 | Kao et al. | |
| 2016/0307937 A1 | 10/2016 | Jin | |
| 2016/0370635 A1 | 12/2016 | Tanaka et al. | |
| 2017/0047032 A1 * | 2/2017 | Nishiyama | G02F 1/1368 |
| 2017/0162149 A1 | 6/2017 | Zhao et al. | |
| 2017/0316730 A1 | 11/2017 | Cheng et al. | |
| 2018/0011504 A1 | 1/2018 | Tanaka et al. | |
| 2018/0068629 A1 * | 3/2018 | Shin | G09G 3/3677 |
| 2018/0122288 A1 | 5/2018 | Huang et al. | |
| 2018/0239186 A1 * | 8/2018 | Kanehiro | B24B 19/26 |
| 2019/0235338 A1 * | 8/2019 | Okamoto | G02F 1/136286 |
| 2019/0237489 A1 * | 8/2019 | Matsukizono | H01L 27/1225 |

FOREIGN PATENT DOCUMENTS

| | | |
|---|---|---|
| CN | 105096861 | 11/2015 |
| CN | 105164743 | 12/2015 |
| CN | 106782416 | 5/2017 |
| TW | 201141064 | 11/2011 |
| TW | I434203 | 4/2014 |
| TW | 201616659 | 5/2016 |
| TW | 201738868 | 11/2017 |

* cited by examiner

DISPLAY DEVICE

CROSS REFERENCE TO RELATED APPLICATION

This application claims the priority benefit of Taiwan application serial no. 107122277, filed on Jun. 28, 2018. The entirety of the above-mentioned patent application is hereby incorporated by reference herein and made a part of specification.

BACKGROUND

Technical Field

The invention relates to a display device. More particularly, the invention relates to a display device having gate driving circuits.

Description of Related Art

The gate on array (GOA) technique refers to a technique in which gate driving circuits are directly formed on an active element array substrate to replace the use of an external driving chip when fabricating a display device.

Generally, the gate driving circuits are disposed outside the display region of the display device and are located at the frame area of the display device. Nevertheless, the gate driving circuits usually occupy a large portion of the frame area, which affects the appearance of the display device to a great extent.

SUMMARY

The invention provides a display device in which a frame area occupied by gate driving circuits can be reduced.

In an embodiment of the invention, a display device includes a plurality of scan lines, a plurality of data lines, a plurality of pixel units, a plurality of gate driving circuits, and a plurality of connection lines. The scan lines extend in a first direction. The data lines extend in a second direction. The pixel units are arranged in a plurality of columns in the first direction and are arranged in a plurality of rows in the second direction. The gate driving circuits extend in the first direction, and each of the gate driving circuits crosses through at least two of the pixel units. At least two gate driving circuits are between two adjacent rows of the pixel units. The connection lines extend in the second direction and are electrically connected to the gate driving circuits. At least part of the connection lines overlap the data lines. The connection lines include a plurality of output lines and a plurality of signal lines. The output lines are electrically connected to the scan lines.

To sum up, in at least one embodiment of the invention, the gate driving circuits are disposed between the pixel units, and a frame area of the display device may therefore be reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
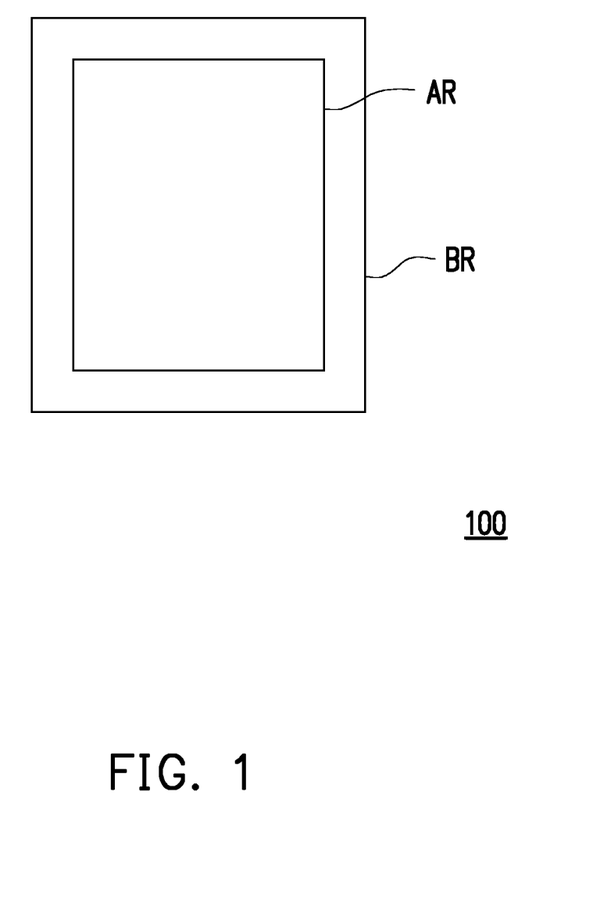
FIG. 1 is a schematic top view of a display device according to an embodiment of the invention.

FIG. 1 is a schematic top view of a display device according to an embodiment of the invention.

With reference to FIG. 1, a display device 100 of this embodiment includes a display region AR and a non-display region BR. The non-display region BR is located at one side of the display region AR, or the non-display region BR may surround the display region AR. In other words, the non-display region BR may be located at one lateral side of the display region AR, and such arrangement can be adjusted according to different needs. For instance, in response to that the non-display region BR surrounds the display region AR, the non-display region BR may be located at one lateral side, two lateral sides, three lateral sides, or four lateral sides of the display region AR when a rectangular display region is applied, and the non-display region BR may be adjacent to the display region AR such that a portion of a periphery or the entire periphery of the display region AR is formed by the non-display region BR when a non-rectangular display region or a circular display region is applied. Generally, gate driving circuits are fabricated on the non-display region BR of a display panel (gate on array, GOA) most of the time, for example, the gate driving circuits are located at a frame area. Nevertheless, in the embodiments of the invention, the gate driving circuits are located in the display region AR. How the gate driving circuits can be disposed in the display region AR is described as follows.

Figure 2:
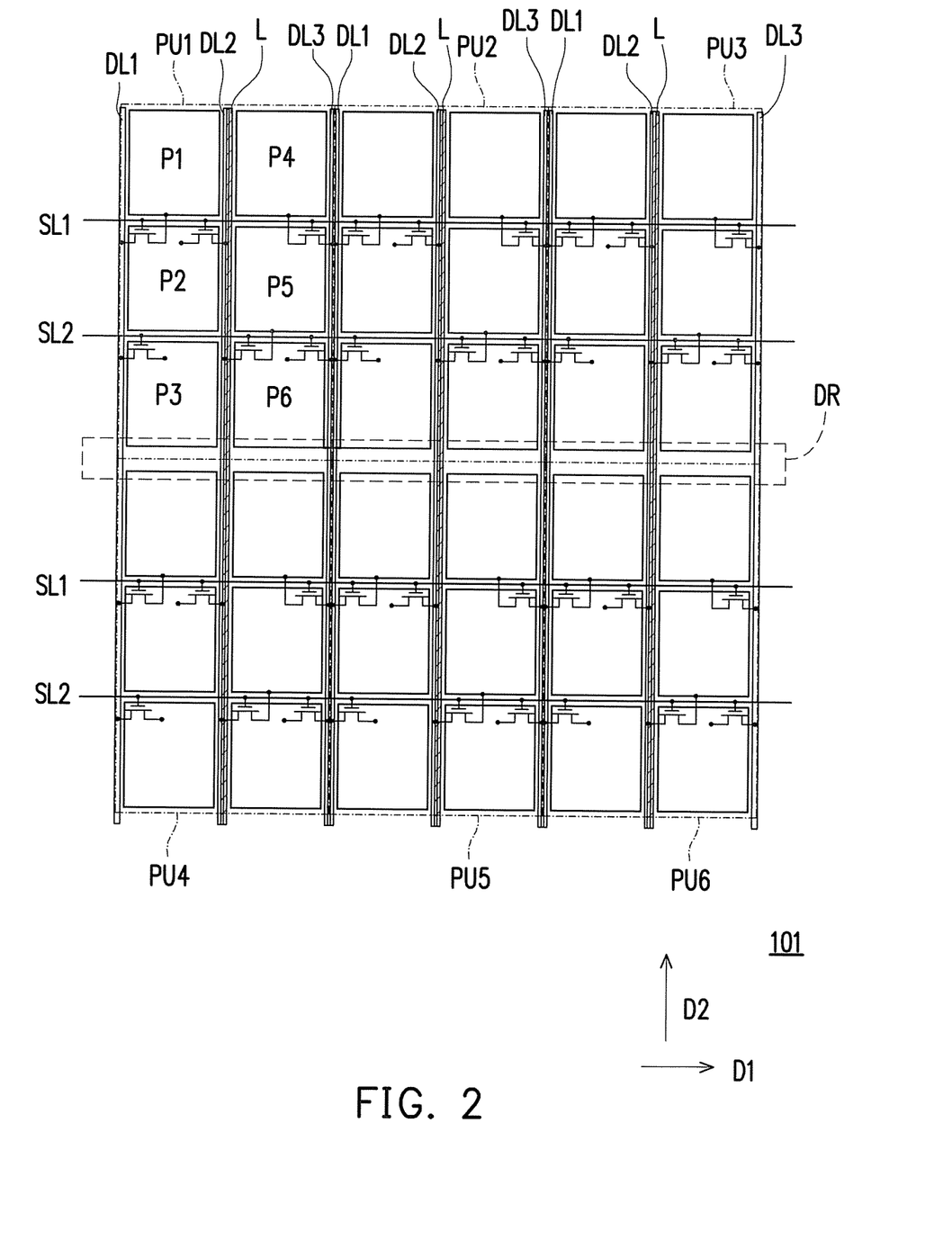
FIG. 2 is a schematic diagram of arrangement of a pixel array according to an embodiment of the invention.

FIG. 2 is a schematic diagram of arrangement of a pixel array according to an embodiment of the invention.

The display region AR of the display device 100 includes a pixel array 101. The pixel array 101 includes a plurality of scan lines (SL1 and SL2), a plurality of data lines (DL1 to DL3), a plurality of pixel units (PU1 to PU6), a plurality of gate driving circuits DR, and a plurality of connection lines L. Only six pixel units and one gate driving circuit are illustrated in FIG. 2, but note that the display device 100 should actually include more pixel units and gate driving circuits.

The scan lines (SL1 and SL2) extend in a first direction D1. The data lines (DL1 to DL3) extend in a second direction D2. The pixel units (PU1 to PU6) are arranged in a plurality of columns in the first direction D1 and are arranged in a plurality of rows in the second direction D2.

Since the pixel units PU2 to PU6 are disposed in a manner identical to that in which the pixel unit PU1 is disposed, only the pixel unit PU1 is illustrated which serves as a representation for illustrative purposes.

In this embodiment, each of the pixel units (PU1 to PU6) is corresponding to two corresponding scan lines (SL1 and SL2), three corresponding data lines (DL1 to DL3), and six corresponding sub-pixels (P1 to P6). The sub-pixel P1 is electrically connected to the scan line SL1 and the data line DL1. The sub-pixel P2 is electrically connected to the scan line SL1 and the data line DL2. The sub-pixel P3 is electrically connected to the scan line SL2 and the data line DL1. The sub-pixel P4 is electrically connected to the scan line SL1 and the data line DL3. The sub-pixel P5 is electrically connected to the scan line SL2 and the data line DL2. The sub-pixel P6 is electrically connected to the scan line SL2 and the data line DL3. In some embodiments, the sub-pixels located at the same column may be sub-pixels with the same color, but the invention is not limited thereto.

Although in this embodiment, each of the pixel units (PU1 to PU6) is exemplified as corresponding to two corresponding scan lines (SL1 and SL2), three corresponding data lines (DL1 to DL3), and six corresponding sub-pixels (P1 to P6), the invention is not limited thereto. In other embodiments, each of the pixel units is corresponding to four corresponding scan lines, six corresponding data lines, and twelve corresponding sub-pixels.

The gate driving circuits DR extend in the first direction D1, and each of the gate driving circuits DR crosses through at least two of the pixel units (PU1 to PU6).

In this embodiment, each row of the pixel units corresponds to two scan lines (SL1 and SL2). In other words, at least two gate driving circuits DR are between two adjacent rows of the pixel units. The two corresponding scan lines (SL1 and SL2) are electrically connected to two corresponding gate driving circuits DR.

The connection lines L extend in the second direction D2 and are electrically connected to the gate driving circuits DR. In this embodiment, at least part of the connection lines L overlap the data lines DL1, the data lines DL2, and/or the data lines DL3. In this embodiment, part of the connection lines L overlap the data lines DL2, and at least part of the data lines overlap with each other. For instance, the data lines DL3 of the pixel units (PU1 and PU4) overlap the data lines DL1 of the pixel units (PU2 and PU5), and the data lines DL3 of the pixel units (PU2 and PU5) overlap the data lines DL1 of the pixel units (PU3 and PU6), but the invention is not limited thereto.

Since the connection lines L overlap the data lines DL1, the data lines DL2 and/or the data lines DL3, an aperture ratio of the display device may less likely to be affected by the connection lines L.

Figure 3:
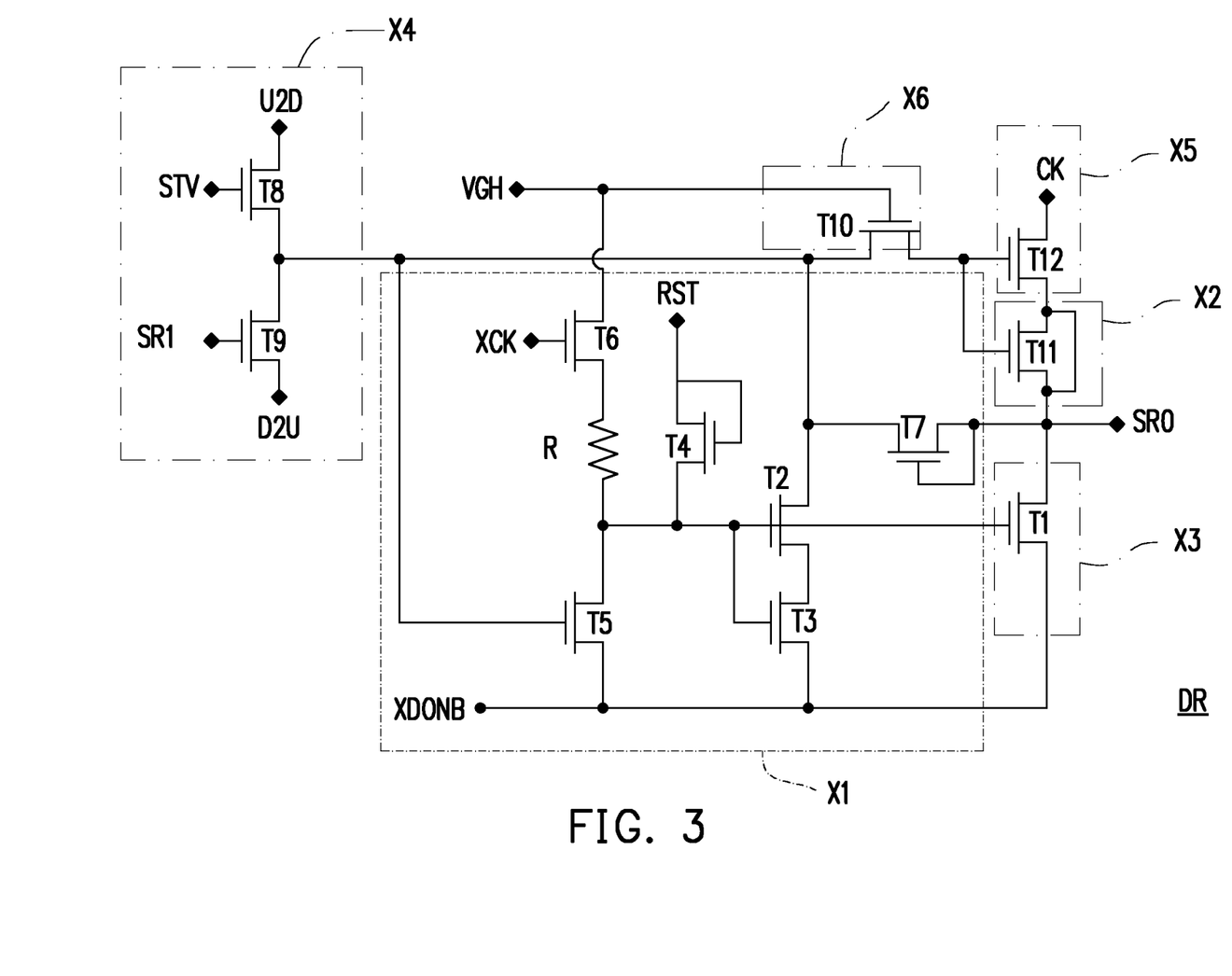
FIG. 3 is a circuit diagram of a gate driving circuit according to an embodiment of the invention.

The connection lines L include a plurality of output lines (shown in FIG. 3) and a plurality of signal lines (shown in FIG. 3). The output lines are electrically connected to the scan lines (SL1 and SL2). For instance, the output lines electrically connect the gate driving circuits DR to the corresponding scan lines (SL1 and SL2), and the signal lines electrically connect the gate driving circuits DR to other elements.

Figure 4:
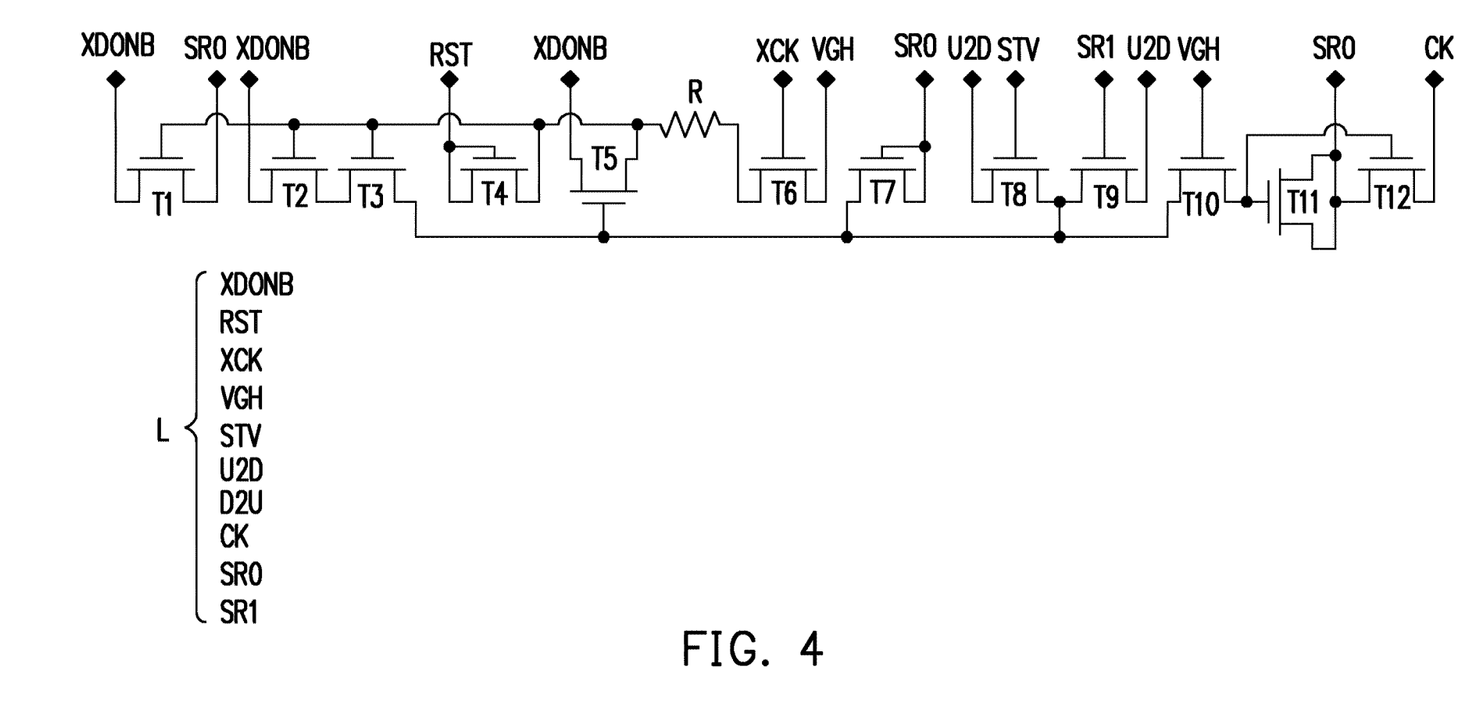
FIG. 4 is a circuit diagram of a gate driving circuit according to an embodiment of the invention.

FIG. 3 is a circuit diagram of a gate driving circuit according to an embodiment of the invention. FIG. 4 is a circuit diagram of a gate driving circuit according to an embodiment of the invention, and the circuit diagram of FIG. 4 illustrates an equivalent circuit of the circuit diagram of FIG. 3. It should be noted that the reference numerals and a part of the contents in the embodiment of FIG. 2 are also used to describe the embodiment of FIG. 3 and FIG. 4, in which the same reference numerals are used to represent identical or similar elements, and thus descriptions of the same technical contents are omitted. Please refer to the descriptions of the previous embodiments for the omitted contents, which will not be repeated hereinafter.

With reference to FIG. 3 and FIG. 4 together, in this embodiment, the gate driving circuit DR includes an active control unit X1, a boost unit X2, a pull-down unit X3, a pre-charge controller X4, and an output unit X5. In some embodiments, the gate driving circuit DR further includes an electricity leakage prevention unit X6.

The boost unit X2 is electrically connected to the active control unit X1. The pull-down unit X3 is electrically connected to the active control unit X1. The pre-charge controller X4 is electrically connected to the active control unit X1. The output unit X5 is electrically connected to the boost unit X2. The electricity leakage prevention unit X6 is electrically connected to the active control unit X1.

To be specific, the pull-down unit X3 includes an active element T1, the active control unit X1 includes active elements T2 to T7 and a resistor R, the pre-charge controller X4 includes active elements T8 and T9, the electricity leakage prevention unit X6 includes an active element T10, the boost unit X2 includes an active element T11, and the output unit X5 includes an active element T12. Each of the active elements T1 to T12 has a control terminal, a first terminal, and a second terminal.

The control terminal of the active element T1 is electrically connected to the control terminal of the active element T2, the control terminal of the active element T3, the second terminal of the active element T4, the resistor R, and the first terminal of the active element T5. The second terminal of the active element T1 is electrically connected to an output line SR0. The second terminal of the active element T1 is electrically connected to the second terminal of the active element T3, the second terminal of the active element T5, and a signal line XDONB.

The control terminal of the active element T2 is electrically connected to the control terminal of the active element T1, the control terminal of the active element T3, the second terminal of the active element T4, the resistor R, and the first terminal of the active element T5. The first terminal of the active element T2 is electrically connected to the second terminal of the active element T7, the second terminal of the active element T10, the control terminal of the active element T5, the first terminal of the active element T9, and the second terminal of the active element T8. The second terminal of the active element T2 is electrically connected to the first terminal of the active element T3.

The control terminal of the active element T3 is electrically connected to the control terminal of the active element T1, the control terminal of the active element T2, the second terminal of the active element T4, the resistor R, and the first terminal of the active element T5. The first terminal of the active element T3 is electrically connected to the second terminal of the active element T2. The second terminal of the active element T3 is electrically connected to the second terminal of the active element T1, the second terminal of the active element T5, and the signal line XDONB.

The control terminal of the active element T4 is electrically connected to the first terminal of the active element T4 and a signal line XCK. The second terminal of the active element T4 is electrically connected to the control terminal of the active element T1, the control terminal of the active element T2, the control terminal of the active element T3, the resistor R, and the first terminal of the active element T5.

The control terminal of the active element T5 is electrically connected to the first terminal of the active element T2, the second terminal of the active element T7, the second terminal of the active element T10, the first terminal of the active element T9, and the second terminal of the active element T8. The first terminal of the active element T5 is electrically connected to the control terminal of the active element T1, the control terminal of the active element T2, the control terminal of the active element T3, the second terminal of the active element T4, and the resistor R. The second terminal of the active element T5 is electrically connected to the second terminal of the active element T1, the second terminal of the active element T3, and the signal line XDONB.

The control terminal of the active element T6 is electrically connected to the signal line XCK. The first terminal of the active element T6 is electrically connected to a signal line VGH and the control terminal of the active element T10. The second terminal of the active element T6 is electrically connected to the resistor R.

The control terminal of the active element T7 is electrically connected to the output line SR0 and the first terminal of the active element T7. The second terminal of the active element T7 is electrically connected to the first terminal of the active element T2, the control terminal of the active element T5, the second terminal of the active element T10, the first terminal of the active element T9, and the second terminal of the active element T8.

The control terminal of the active element T8 is electrically connected to a signal line STV. The first terminal of the active element T8 is electrically connected to a signal line U2D. The second terminal of the active element T8 is electrically connected to the first terminal of the active element T2, the control terminal of the active element T5, the second terminal of the active element T10, the first terminal of the active element T9, and the second terminal of the active element T7.

The control terminal of the active element T9 is electrically connected to an output line SR1. The first terminal of the active element T9 is electrically connected to the first terminal of the active element T2, the control terminal of the active element T5, the second terminal of the active element T10, the second terminal of the active element T8, and the second terminal of the active element T7. The second terminal of the active element T9 is electrically connected to a signal line D2U.

The control terminal of the active element T10 is electrically connected to the signal line VGH and the first terminal of the active element T6. The first terminal of the active element T10 is electrically connected to the control terminal of the active element T11 and the control terminal of the active element T12. The second terminal of the active element T10 is electrically connected to the first terminal of the active element T2, the control terminal of the active element T5, the first terminal of the active element T9, the second terminal of the active element T8, and the second terminal of the active element T7.

The control terminal of the active element T11 is electrically connected to the first terminal of the active element T10 and the control terminal of the active element T12. The first terminal of the active element T11 is electrically connected to the second terminal of the active element T11, the second terminal of the active element T12, and the output line SR0.

The control terminal of the active element T12 is electrically connected to the first terminal of the active element T10 and the control terminal of the active element T11. The first terminal of the active element T12 is electrically connected to a signal line CK. The second terminal of the active element T12 is electrically connected to the first terminal of the active element T11, the second terminal of the active element T11, and the output line SR0.

Although FIG. 2 is taken as an example to represent the circuit diagram of the gate driving circuit DR of this embodiment, the invention is not limited thereto. In other embodiments, the gate driving circuit DR may also be a driving circuit to be represented by a circuit diagram of other forms.

Figure 5A:
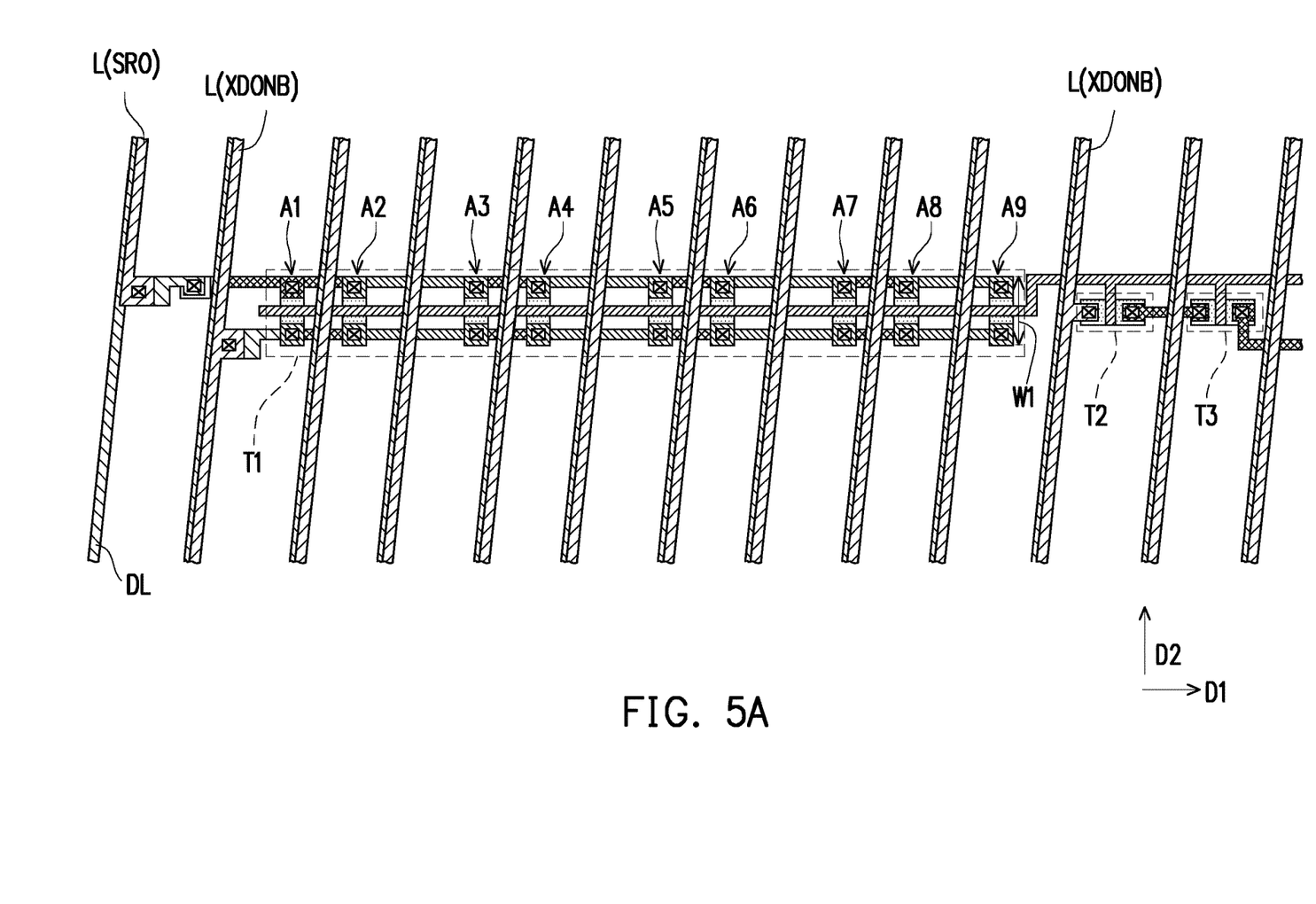
FIG. 5A is a schematic local top view of a gate driving circuit according to an embodiment of the invention.
Figure 5B:
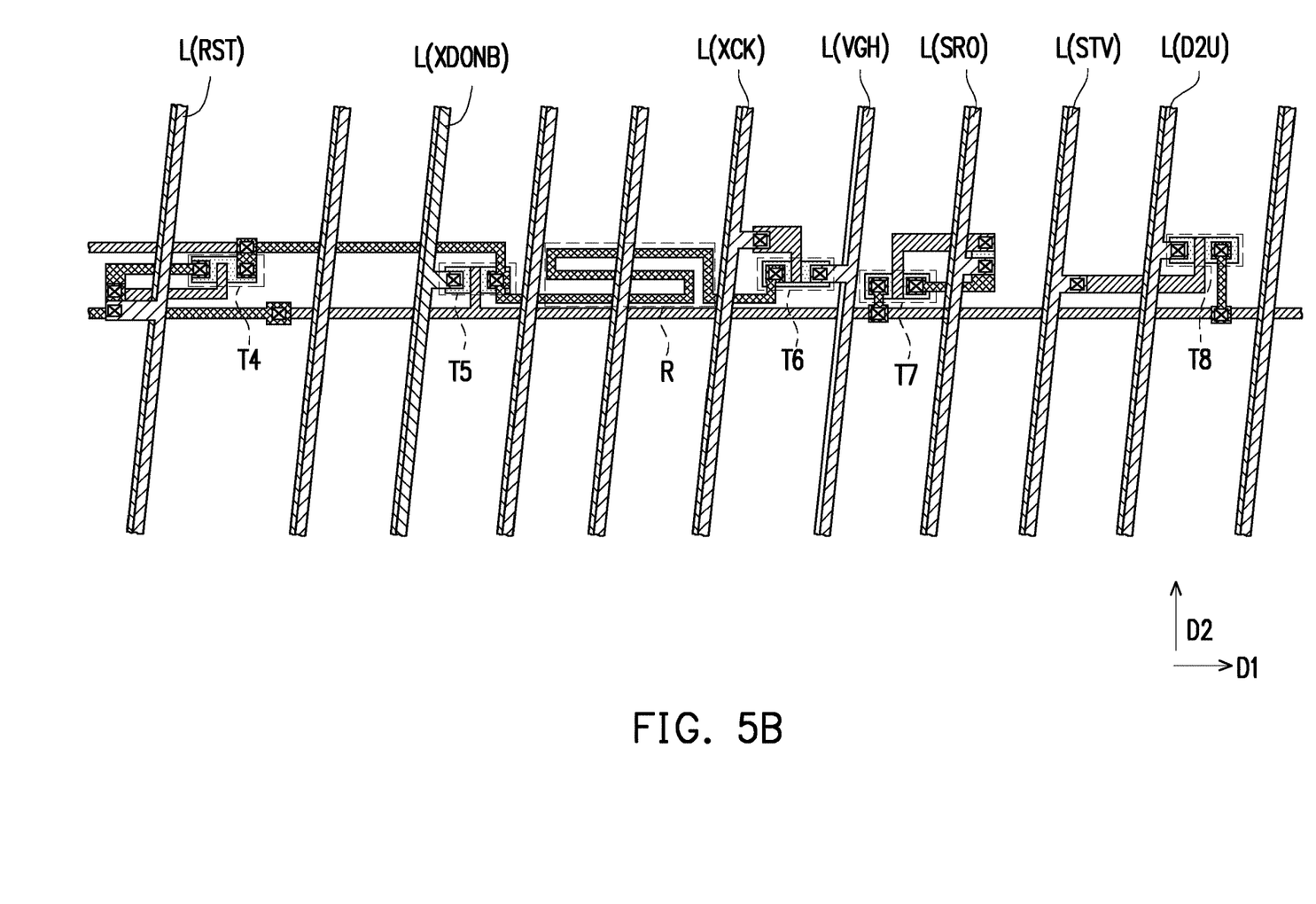
FIG. 5B is a schematic local top view of a gate driving circuit according to an embodiment of the invention.
Figure 5C:
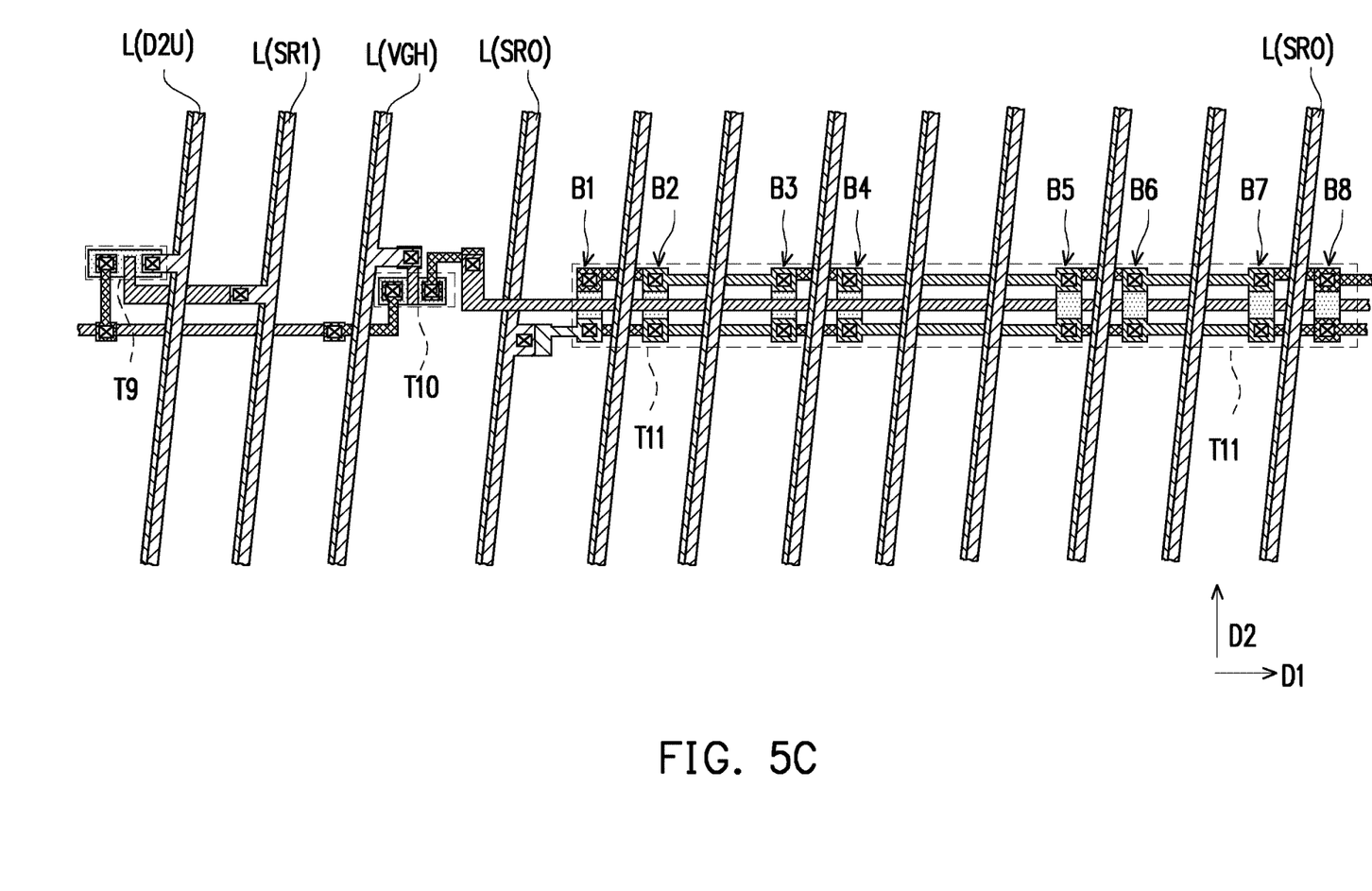
FIG. 5C is a schematic local top view of a gate driving circuit according to an embodiment of the invention.
Figure 5D:
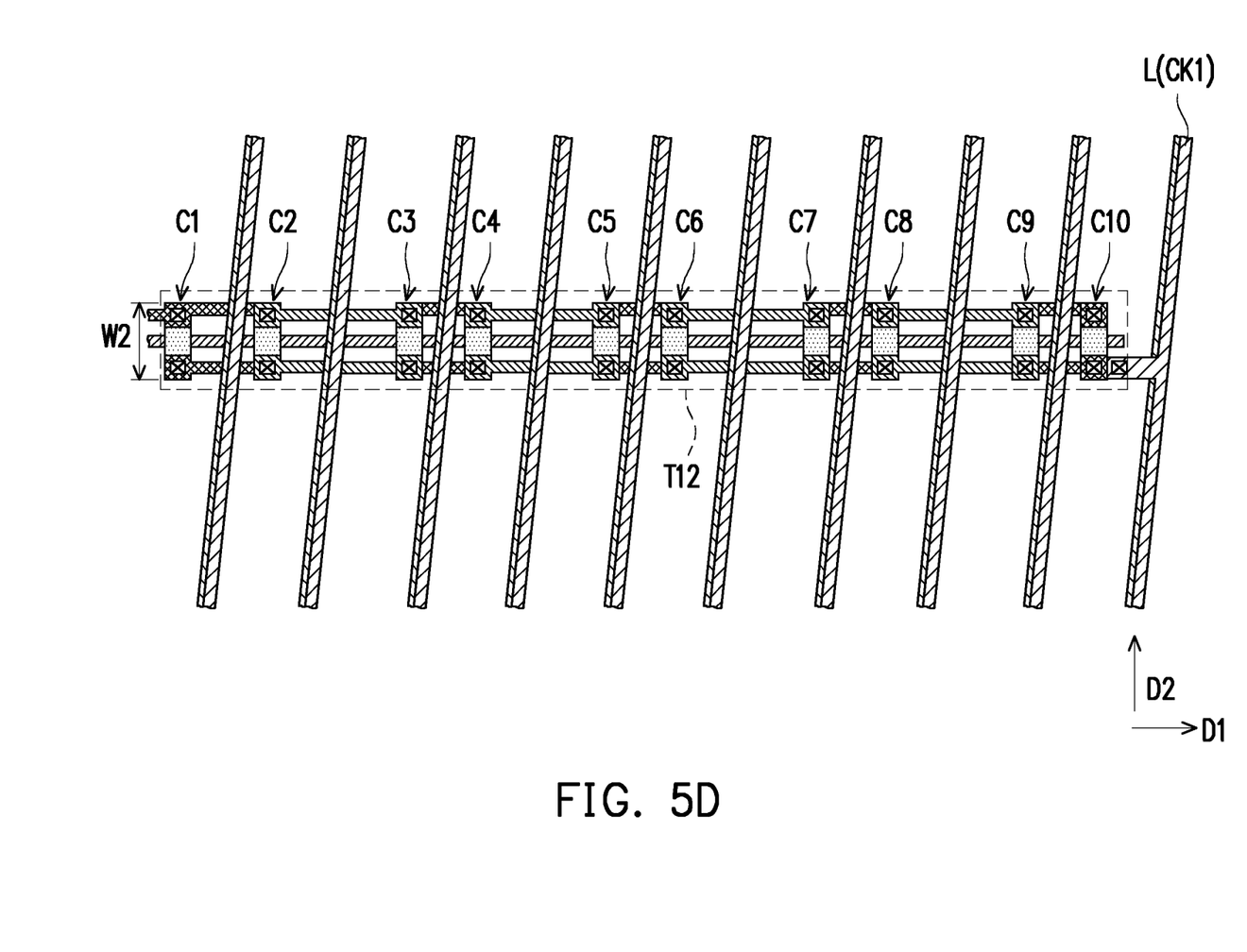
FIG. 5D is a schematic local top view of a gate driving circuit according to an embodiment of the invention.

FIG. 5A is a schematic local top view of a gate driving circuit according to an embodiment of the invention. FIG. 5B is a schematic local top view of a gate driving circuit according to an embodiment of the invention. FIG. 5C is a schematic local top view of a gate driving circuit according to an embodiment of the invention. FIG. 5D is a schematic local top view of a gate driving circuit according to an embodiment of the invention.

The gate driving circuits of FIG. 5A to FIG. 5D correspond to the circuit diagram of FIG. 4. FIG. 5A to FIG. 5D are schematic top views of different locations of a gate driving circuit. The leftmost side of FIG. 5B is followed by the rightmost side of FIG. 5A, the leftmost side of FIG. 5C is followed by the rightmost side of FIG. 5B, and the leftmost side of FIG. 5D is followed by the rightmost side of FIG. 5C.

In FIG. 5A to FIG. 5D, a number of the connection lines L and a number of the data lines DL at a periphery of the gate driving circuit DR are provided for illustration only, and some of the data lines DL are omitted in FIG. 5A to FIG. 5D. In addition, from a macro perspective, the connection lines L and the data lines DL extend in the second direction D2. Nevertheless, the connection lines L and the data lines DL may be shaped as a zigzag or other shapes, included angles may be provided between part of the connection lines L and part of the data lines DL and the second direction D2.

In this embodiment, the pull-down unit X3 includes the active element T1 (a pull-down active element), and the active element T1 overlaps two or more of the data lines DL. For instance, the active element T1 is constituted by a plurality of thin film transistors A1 to A9 connected in series together. Drains of the thin film transistors A1 to A9 are electrically connected to each other, sources of the thin film transistors A1 to A9 are electrically connected to each other, and gates of the thin film transistors A1 to A9 are electrically connected to each other. Although the active element T1 is exemplified as having nine thin film transistors in this embodiment, the invention is not limited thereto. In other embodiments, the active element T1 includes nine or more thin film transistors, for example, includes twelve thin film transistors.

In a preferred embodiment, an extending length of the gate driving circuit DR in the second direction D2 is equal to an extending length of the active element T1 in the second direction D2. In other words, a width of the gate driving circuit DR preferably does not exceed a width W1 of the active element T1. The width W1 of the active element T1 is, for example, 19.5 microns±5%, but the invention is not limited thereto. In some embodiments, the width W1 is less than 30 microns to improve the channel heating problem, but the invention is not limited thereto.

In this embodiment, the boost unit X2 includes the active element T11 (a boost active element), and the active element T11 overlaps two or more of the data lines DL. For instance, the active element T11 is constituted by a plurality of thin film transistors B1 to B8 connected in series together. Drains of the thin film transistors B1 to B8 are electrically connected to each other, sources of the thin film transistors B1 to B8 are electrically connected to each other, and gates of the thin film transistors B1 to B8 are electrically connected to each other. Although the active element T11 is exemplified as having eight thin film transistors in this embodiment, the invention is not limited thereto. In other embodiments, the active element T11 includes eight or more thin film transistors, for example, includes twelve thin film transistors.

In this embodiment, the output unit X5 includes the active element T12 (an output active element), and the active element T12 overlaps two or more of the data lines DL. For instance, the active element T12 is constituted by a plurality of thin film transistors C1 to C10 connected in series together. Drains of the thin film transistors C1 to C10 are electrically connected to each other, sources of the thin film transistors C1 to C10 are electrically connected to each other, and gates of the thin film transistors C1 to C10 are electrically connected to each other. Although the active element T12 is exemplified as having ten thin film transistors in this embodiment, the invention is not limited thereto. In other embodiments, the active element T12 includes ten or more thin film transistors, for example, includes fifteen thin film transistors.

In a preferred embodiment, the extending length of the gate driving circuit DR in the second direction D2 is equal to an extending length of the active element T12 in the second direction D2. In other words, the width of the gate driving circuit DR preferably does not exceed a width W2 of the active element T12. The width W2 of the active element T12 is, for example, 19.5 microns±5%, but the invention is not limited thereto. In some embodiments, the width W2 is less than 30 microns to improve the channel heating problem, but the invention is not limited thereto.

The output unit X5 and the pull-down unit X3 are respectively adjacent to a left terminal and a right terminal of the gate driving circuit DR, and the boost unit X2 is adjacent to the output unit X5. In other words, the active element T1, the active element T11, and the active element T12 having larger volume in the gate driving circuit DR are disposed near the left and the right terminals of the gate driving circuit DR. In this way, traces crossing through the active element T1 and the active element T12 in the gate driving circuit DR may be reduced, and the width of the gate driving circuit DR may thereby be reduced.

In this embodiment, the active element T7, the active element T12, the active element T11, and the active element T1 are connected to the same scan line SL through the output line SR0 overlapping the data lines DL, and a more flexible circuit layout may thus be provided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display device, comprising:
    a plurality of scan lines extending in a first direction;
    a plurality of data lines extending in a second direction;
    a plurality of pixel units arranged in a plurality of columns in the first direction and arranged in a plurality of rows in the second direction, wherein each of the plurality of pixel units is corresponding to two corresponding scan lines, three corresponding data lines, and six corresponding sub-pixels;
    a plurality of gate driving circuits extending in the first direction, each of the plurality of gate driving circuits crossing through at least two of the pixel units, wherein at least two gate driving circuits are between two adjacent rows of the plurality of pixel units; and
    a plurality of connection lines extending in the second direction and electrically connected to the plurality of gate driving circuits, wherein at least part of the connection lines overlap the plurality of data lines, the plurality of connection lines comprise a plurality of output lines and a plurality of signal lines, and the plurality of output lines are electrically connected to the plurality of scan lines;
    wherein the two corresponding scan lines comprise a first scan line and a second scan line, the three corresponding data lines comprise a first data line, a second data line, and a third data line, and the corresponding six sub-pixels comprise:
    a first sub-pixel, electrically connected to the first scan line and the first data line;
    a second sub-pixel, electrically connected to the first scan line and the second data line;
    a third sub-pixel, electrically connected to the second scan line and the first data line;
    a fourth sub-pixel, electrically connected to the first scan line and the third data line;
    a fifth sub-pixel, electrically connected to the second scan line and the second data line; and
    a sixth sub-pixel, electrically connected to the second scan line and the third data line.

2. The display device as claimed in claim 1, wherein the two corresponding scan lines are respectively electrically connected to two corresponding gate driving circuits.

3. The display device as claimed in claim 1, wherein at least part of the plurality of data lines overlap with each other.

4. The display device as claimed in claim 1, wherein each of the plurality of gate driving circuits comprises:
    an active control unit;
    a boost unit, electrically connected to the active control unit;
    a pull-down unit, electrically connected to the active control unit;
    a pre-charge controller, electrically connected to the active control unit; and
    an output unit, electrically connected to the boost unit.

5. The display device as claimed in claim 4, wherein each of the plurality of gate driving circuits further comprises:
    an electricity leakage prevention unit, electrically connected to the active control unit.

6. The display device as claimed in claim 4, wherein the output unit of at least one of the plurality of gate driving circuits and the pull-down unit of the at least one of the plurality of gate driving circuits are respectively adjacent to a left terminal and a right terminal of the at least one of the plurality of gate driving circuits in the at least one of the plurality of gate driving circuits.

7. The display device as claimed in claim 4, wherein the pull-down unit comprises a pull-down active element, and the pull-down active element overlaps two or more of the plurality of data lines.

8. The display device as claimed in claim 7, wherein an extending length of the plurality of gate driving circuits in the second direction is equal to an extending length of the pull-down active element in the second direction.

9. The display device as claimed in claim 4, wherein the output unit comprises an output active element, and the output active element overlaps two or more of the data lines.

10. The display device as claimed in claim 9, wherein an extending length of the plurality of gate driving circuits in the second direction is equal to an extending length of the output active element in the second direction.

* * * * *